(12) United States Patent
Loucks

(10) Patent No.: US 6,359,524 B1
(45) Date of Patent: Mar. 19, 2002

(54) MODULATION PULSE-TOP RIPPLE COMPENSATION FOR A TRAVELLING WAVE TUBE PULSER

(75) Inventor: Richard Sidney Loucks, Northridge, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 06/328,127

(22) Filed: Dec. 7, 1981

(51) Int. Cl.[7] .............................................. H03K 7/00
(52) U.S. Cl. ...................................... 332/107; 327/178
(58) Field of Search ...................... 332/15, 107; 328/31, 328/54; 323/211; 327/178

(56) References Cited

U.S. PATENT DOCUMENTS 4,222,008 A * 9/1980 Mezrich ....................... 328/31

* cited by examiner

Primary Examiner—Theodore M. Blum

(57) ABSTRACT

A circuit for applying a compensating ripple signal at a low voltage point, such as the collector electrode of a travelling wave tube to compensate for pulse-top ripple extant on a high voltage pulse applied at the travelling wave tube cathode, to provide a substantially constant voltage across the travelling wave tube during pulsing to preserve its radio frequency phase and amplitude characteristics. The portion of the pulse-top including the undesired ripple is compared against the applied compensating collector signal and the result is digitized and stored discretely in a plurality of sample bins over the duration of the modulation pulse. The stored digital values are updated over a plurality of successive modulation pulses until an equilibrium is reached, a random access memory being arranged to provide a readout over one half of each of the sample bins and to receive updating in the remaining halves of the corresponding sample bins.

10 Claims, 2 Drawing Sheets

LARGE ERROR CAUSES INCREMENT INCREASE IN IMAGE ON SUCCESSIVE PULSE

WAVEFORMS SHOWING ($E_1 = E_2 = E_3 = E_4$) CONSTANT VOLTAGE ACROSS TWT IN FIG. 1

MODULATION PULSE-TOP RIPPLE COMPENSATION FOR A TRAVELLING WAVE TUBE PULSER

BACKGROUND OF THE INVENTION

1. Field of the Invention

The invention generally concerns radar transmitter pulse modulators and, more specifically, relates to such modulators employed with travelling wave tube radio frequency power amplifiers.

2. Description of the Prior Art

Quite probably the classical solution for this problem is a pulse-top clipper which can be arranged to eliminate the pulse-top ripple by substantially clamping the instantaneous power pulse amplitude at a predetermined level. Although such a circuit is relatively simple, there are some serious disadvantages associated therewith. One disadvantage is the necessity of dumping pulse energy in excess of the clipping level during the interpulse period. In addition to the significant waste of energy thereby resulting, the energy dumping process inherently makes the clip level a function of interpulse period (i.e., of pulse repetition frequency). Moreover, tilt of the pulse-top results causing the same type of intrapulse phase and/or amplitude variations of the radio frequency power at the travelling wave tube output as are caused by the pulse top ripple. Another possible approach to the problem of reducing the pulse-top ripple which usually suggests itself to those of skill in this art in similar situations is the application of feedback or feed-forward, i.e., by putting a closed loop around the entire device. Unfortunately, such a loop would be complex, would necessarily be required to handle a high level of power and must be capable of rapid (high bandwidth) operation. Still further, such a closed loop approach must discriminate between rise and fall times of the power pulse and the ripple, preserving the former and cancelling the latter.

Still further, the power modulation pulse to the travelling wave tube can be generated as a high powered gate without the use of resonant or artificial transmission line elements present in the so-called line type modulators. Generation of such a high powered gate necessarily requires enormous high voltage and high current power supply backup. Accordingly, that alternative cannot be seriously considered.

The so-called line type pulse modulator is a fairly standard and well-known device for the generation of the power pulse required to operate pulsed radar transmitting generators such as magnetrons, amplitrons and travelling wave tubes.

The selection of a travelling wave tube for a power amplifier application in a modern radar system is based on its known advantages as applicable to overall system characteristics which are not, per se, a part of the present invention. The criteria for selection of a travelling wave tube are well known, however, and given that selection, the choice of a line type modulator follows.

The line type modulator is basically a section of artificial delay line including passive inductive capacitive and resistive circuit elements, the characteristics of which are relatively stable and repeatable at least over short and intermediate times.

It is known that pulse-operable, power, travelling tubes are inherently amplitude and phase modulated by variations in modulation pulse amplitude. Since the line type modulator is simple and relatively inexpensive for use where single or at least non-agile pulse width is involved, its use is highly desirable.

Unfortunately, however, realizable (nominally twenty section plus or minus) pulse forming networks produce significant pulse-top ripple (usually on the order of one percent). Where modern radar signal processing (such as for MTI cancellation) is to be used, this ripple must be reduced in the travelling wave tube system, particularly where phase coded transmitted pulses are employed for pulse compression upon reception. The previously mentioned phase and amplitude perturbations produced by the modulation pulse-top ripple in a travelling wave tube system tends to deteriorate the performance of such phase-coded systems. In general, a maximum ripple of only 0.01 percent can be tolerated if the received signal correlation time side lobes are to be held to not more than 40 db.

The classical and known prior art approaches which might be expected to provide reduction of the modulation pulse-top ripple are not satisfactory for the reasons given.

In accordance with the foregoing, it can be seen that for modern radar systems having the characteristics and capabilities referred to, there is an urgent need for apparatus capable of effectively yet inexpensively affording the desired degree of pulse-top ripple reduction or compensation for use in the travelling wave tube system aforementioned. The manner in which the present invention deals with the prior art disadvantages to produce such a simple and effective pulse-top ripple compensator for the travelling wave tube application as well as for other potential applications will be understood as this description proceeds.

SUMMARY OF THE PRESENT INVENTION

The invention makes use of digitizing and digital encoding techniques for constructing an image wave representative of the pulse-top ripple. This image is stored as a series of digital sample values taken throughout the time duration of the ripple waveform and continuously updated by comparison of the actual ripple with the digitally stored image converted back to analog values while the ripple waveform "rides" on the top of a large voltage pulse.

Forty-six thousand volts peak amplitude modulation pulses are used in one application in which the invention may be used. However, the compensating stored and re-converted ripple signal is applied at a relatively low potential with respect to ground to the travelling wave tube collector electrode. It will be noted that the particular type of travelling wave tube illustrated in the drawings does not have a grid electrode, but rather is intended for negative going pulse application to the cathode element for pulse operation.

The application of the compensating waveform is of the same polarity when applied to the collector electrode as is extant at the travelling wave tube cathode, the result being a substantially constant (save only a small residual ripple component) potential across the travelling wave tube, i.e., from cathode to collector. Accordingly, the amplitude and phase perturbations introduced by the travelling wave tube are greatly reduced. This effect constitutes fulfillment of the general objective of the invention.

The details of a representative implementation of the invention are presented hereinafter.

DETAILED DESCRIPTION

Figure 1:
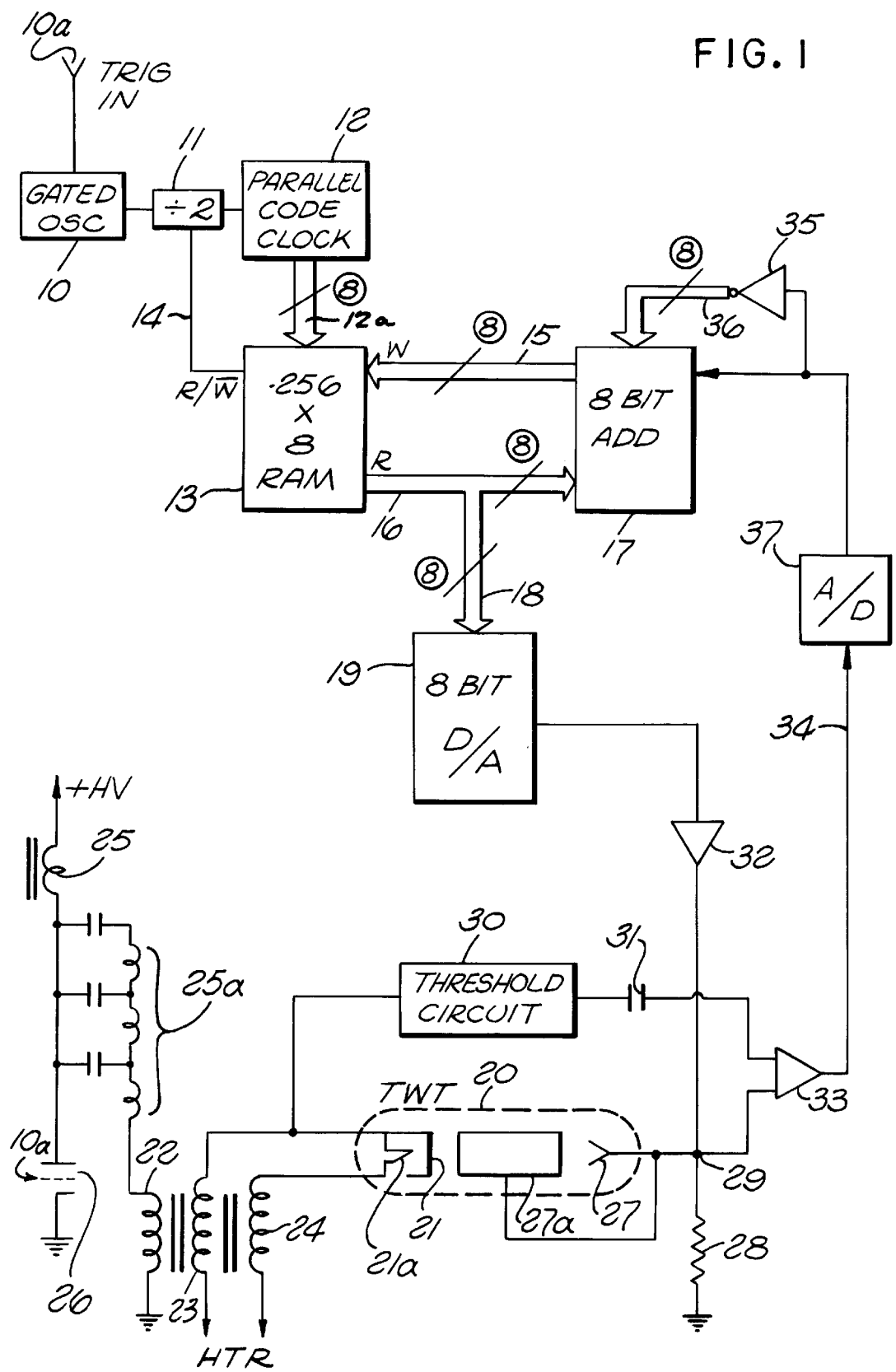
FIG. 1 is a schematic block diagram of a system according to the invention.

Referring now to FIG. 1, the essential elements of a typical embodiment according to the invention are depicted.

The travelling tube 20 has a conventional cathode 21, a heater 21a, a collector 27 and a body 27a. In the mode of operation contemplated, the collector 27 is electrically connected to the body 27a, and both are directly connected to the junction 29 of amplifier 32 and resistor 28. The signal generated at junction 29 will be more fully described hereinafter.

Figure 3:
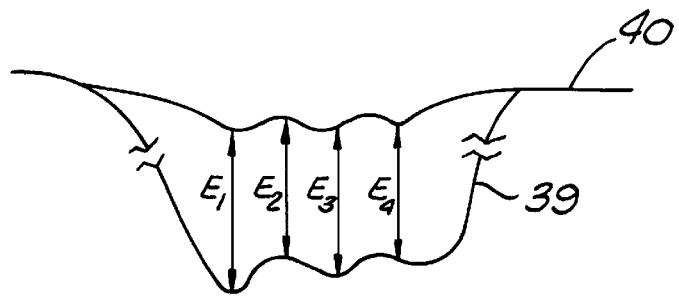
FIG. 3 illustrates the travelling wave tube cathode pulse-top ripple and a corresponding collector compensating waveform.

A conventional high voltage, high power pulse modulator includes the line type pulse forming network 25a, a charging choke 25 and a switching tube 26. The switching tube 26 is often a hydrogen thyratron or the like, and is triggered into conduction by a system trigger pulse at 10a on its grid electrode. The resulting conduction of switch tube 26 "dumps" the stored energy in the line type pulse forming network 25a around a loop including tube 26 and the primary winding 22 of a high powered pulse transformer. A conventional bifilar winding arrangement provides secondaries 23 and 24 to pulse the cathode 21 of the travelling wave tube. The particular arrangement allows heater source power to be carried through the bifilar secondaries 23 and 24, and it will be noted that the internal travelling wave tube connection of the cathode to one side of the heater avoids the build up of a large differential voltage between heater and cathode during presence of the high voltage pulse. This high voltage pulse at the junction 21a would typically be of the form of 39 of FIG. 3. The negative going pulse 39 will be seen to include pulse-top ripple (or perhaps more properly pulse-bottom ripple). In FIG. 3 the total amplitude of the negative going pulse 39 is much greater compared to the ripple image depicted at 40 although the amplitude of the ripple components themselves will be understood to be substantially equal.

Referring again to FIG. 1, a threshold circuit 30 is shown, this circuit passing substantially only that portion of the pulse 39 which includes the ripple waveform. That ripple waveform passed by circuit 30 passes through capacitor 31 to the input of the comparator 33. Basically, comparator 33 is a differential amplifier with a gain of unity, and it will now be seen that element 33 provides an output which is the algebraic difference between the output of threshold circuit 30 and the signal at junction 29.

Up to this point in the discussion, the origin of the signal at 29, which is in fact waveform 40 from FIG. 3, has not been discussed. Actually, the waveform at 29 is the compensating waveform hereinbefore referred to, and is applied through a driver amplifier 32. Resistor 28 is of relatively low value consistent with the need to carry the peak pulse current through the travelling wave tube to ground return. Accordingly, a very low output impedance from amplifier 32 is required, however, such considerations are matters of ordinary skill in this art.

Referring again to the output of comparator 33, whatever value positive or negative error signal is supplied therefrom is applied to the analog-to-digital converter 37. Converter 37 is preferably limited to a single digit change in either the positive or negative direction, i.e., a change of the least significant digit of the multi-digit code carried by adder 17.

At this point, it should be indicated that an 8-bit code has been selected as typical although it should be clearly understood that a shorter or longer code word could be implemented as a matter of ordinary skill once the nature of the invention is understood. Accordingly, the leads 12a, 15, 16 and 36 comprise eight conductor cables to accommodate the aforementioned 8-bit code words, those leads being each further identified by an encircled FIG. 8.

The encoded samples describing the series of instantaneous ripple image waveform is stored in the random access memory 13 in the form of (typically) 256 eight-bit digital words. Here again it should be emphasized that 256 samples is typical or representative, however, more or fewer instantaneous ripple waveform samples could be employed as a matter of design option.

Figure 2:
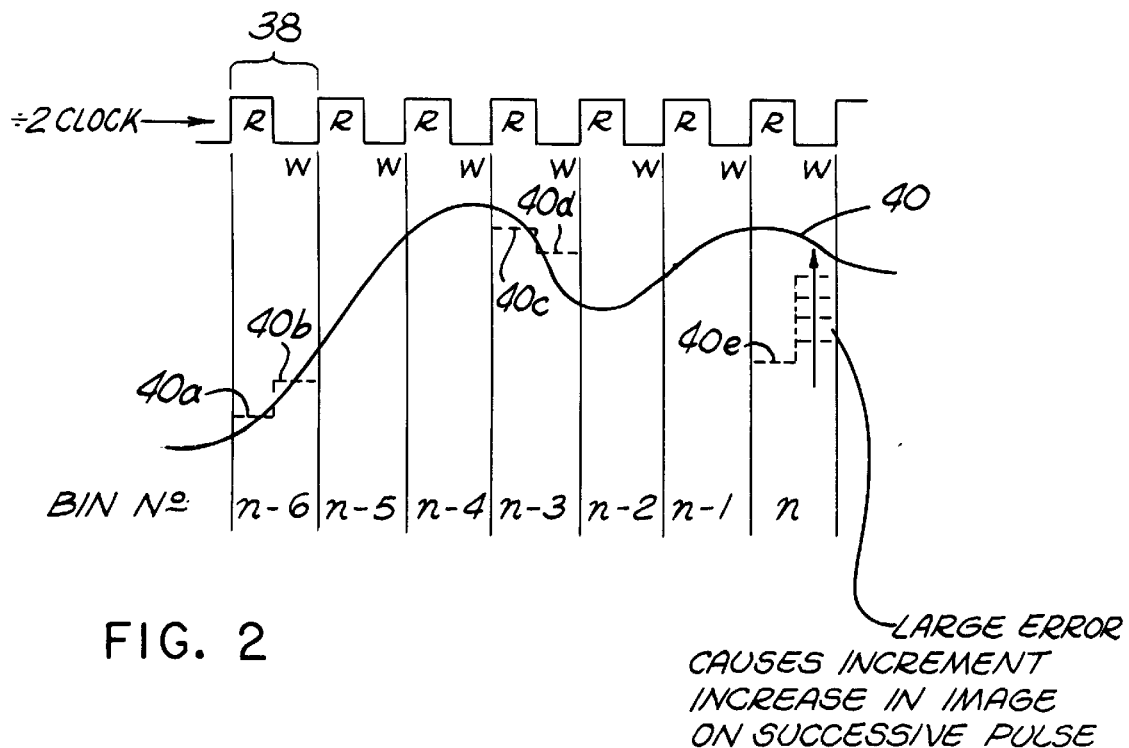
FIG. 2 graphically illustrates the memory read/write operation for producing the compensating waveform image according to the invention.

As this description proceeds, reference is also made to FIG. 2 which relates the sampling and image storing process. After the travelling wave tube modulation pulse with pulse-top ripple extant at point 21b on FIG. 1 is passed through the threshold circuit 30 and the coupling capacitor 31, substantially only the ripple top is applied to comparator 33. This comparator 33 is essentially a differential amplifier and the system then regulates the waveform 40 at point 29 such that it matches the ripple waveform 38 shown on FIG. 2.

At this point it is useful to again refer to FIG. 3 where the voltage waveform applied at point 21a of FIG. 1 is represented by waveform 39 and the compensating waveform applied at point 29 on FIG. 1 is represented by waveform 40. The waveform 39 has been intentionally shortened in the vertical dimension in the showing of FIG. 3, however, the point to be illustrated is that the instantaneous values e1, e2, e3 and e4 are all equal, this producing a constant applied voltage across the travelling wave tube during the modulation pulse. It is the constant voltage condition across the travelling wave tube which preserves its phase and amplitude characteristics which have hereinbefore been identified as important in moving target indicator and other signal processing systems. From FIG. 3 it will be understood that the arrangement according to the invention rather than attempting to eliminate the pulse-top ripple of the modulation pulse effectively compensates or counterbalances it in a unique manner.

Referring again to FIG. 1 taken with FIG. 2, it will be seen that a gated clock circuit 10 generates clock pulses in a synchronous-start fashion in response to system trigger input 10a. This same trigger input was previously seen to be applied to the line-type modulator switch tube 26. The generation of the modulation pulse applied to the travelling wave tube cathode 21 as hereinbefore described is therefore synchronous with the train of pulses generated in the gated oscillator 10, these pulses representing the sample bins depicted in FIG. 2. Actually, FIG. 2 is exaggerated for the purposes of illustration, many more samples per unit time being necessary than the simplified showing of FIG. 2 would indicate. In this description it has been assumed that 256 samples are taken throughout the time of the travelling wave tube modulation pulse. Thus, the change of amplitude in the residual (uncancelled) waveform from 33 between the read half and the write half of each sample bin is quite small.

The frequency of the gated oscillator 10 is twice the number of samples per TWT modulator pulse, i.e., in this example/512 cycles within each modulator pulse. In terms of Hz, the gated oscillator frequency is, of course, much higher than 512 since the travelling wave tube modulator pulse is itself not more than one millisecond in duration in a practical system. For example, the "ringing" frequency of the gated oscillator 10 would be 512 times $10^5$ Hz if the travelling wave tube modulation pulse had a duration of 10 microseconds.

It is the function of the divide by 2 circuit 11, which functionally need only be a bi-stable gate circuit, to produce alternate read and write enabling gates to the random access memory (RAM) 13. The output of the divider 11 to the parallel code clock 12 is at the gated oscillator 10 frequency and this device 12 acts to clock the 256 words in parallel through the 8 conductor parallel bus 12a. As previously indicated, each of the 256 sample amplitude codes in the random access memory 13 is an 8-bit code word corresponding to the desired waveform instantaneous amplitude at 29 in a corresponding time bin.

The waveform 40 of FIG. 2 is constructed from the succession of digital words, 256 such words in the arbitrary example being described reconverted to analog in 19. As the parallel code clock 12 "clocks" these words in succession, the RAM read output 16 contains an 8-bit digital word to the 8-bit adder 17 as well as to the 8 digital to analog converter 19 via the 8 conductor lead 18.

In FIG. 2, an arbitrary time slice out of a voltage pulse applied at the cathode 21 of travelling wave tube 20 is presented. If the nth time sampling bin within the travelling wave tube modulation (voltage) pulse is the 256 th such sample, then the bin numbered n-6 in FIG. 2 is an arbitrary earlier time bin, i.e., the sixth earlier one. This earliest bin depicted on FIG. 2 is also identified at 38 and comprises substantially 50 percent read time and 50 percent write time identified as "R" and "W". Although it is not necessary that the read and write portions of these bins each be exactly half of the time of a given bin, there would appear to be no compelling reason for making them significantly otherwise.

Still further, and as previously indicated, the time sample bins are each of much shorter duration than FIG. 2 would tend to indicate, hence the amount of amplitude change of the compensating ripple waveform 40 being generated is much less within each sample time bin than suggested by FIG. 2, the graphic proportions of FIG. 2 being deliberately distorted for the sake of description.

It will be realized that during the time the parallel code clock 12 is successively clocking each of the 256 sample words stored in memory 13, the interval division supplied by 11 via lead 14 operates to control the memory 13 between read and write modes within each sample bin as depicted on FIG. 2. The same output word on the read bus 16 from memory 13 is also supplied to the 8-bit adder 17 where corrections are effected in accordance with the input from analog-to-digital converter 37 via amplifier 35 and 8 conductor signal bus 36, these being then written into the same bin in RAM 13 in the write half of that bin. This latter structure is intended to depict a "carry" circuit arrangement, and it is preferred that analog-to-digital converter 37 be limited to a single bit (up or down in digital value) so that the resulting "updating" in the adder 17 is limited to 1 bit in each sample bin for each cycle of the high powered (voltage) pulse applied to the travelling wave tube cathode 21. As previously indicated, the pulse modulator components including the pulse forming network 25a with its charging choke 25 and the other components associated therewith are passive and not subject to significant short term changes which would cause significant short term variations in the pulse-top ripple of the set modulation pulse. Accordingly, the updating of the compensatory ripple shape injected at point 29 at the corresponding maximum incremental amplitude change rate thereby provided is normally satisfactory.

The current return resistor 28 is not critical as to its resistance; however, it should be sufficiently low so as not to significantly limit pulse current flow through travelling wave tube 20, but not so low in value as to require inordinately large drive currents from the power amplifier 32. Comments concerning the gain of amplifier 32 will be found later in this description.

Referring again to FIG. 2, it will be noted that typical read and write levels 40a and 40b are shown in the n-6 bin. Since the average value of the waveform 40 during the 40a time will be determined to be below the level 40a, which is the previous storage level in that bin, the value 40b will be read in to the memory 13 during the write half of the n-6 sample (time) bin. The converse will be seen to be true with respect to 40c and 40d in the n-3 bin. Finally, in the nth bin a much too low stored value 40e must be corrected in a number of successive steps, one step for that sample bin within each of the successive travelling wave tube modulator pulses.

The parallel code clock 12 will be recognized as a time period divider, i.e., producing 256 clock pulse groups of 8-bit each for each travelling wave tube modulator pulse (hereinafter called voltage pulse) corresponding to each system trigger at 10a.

It is, of course, necessary to exclude most of the modulator pulse pedestal extant on the cathode 21 of the travelling wave tube 20. For this purpose a threshold or clipper circuit 30 is included, the output of which is AC coupled to the comparator 33 via capacitor 31.

Taking an example of 1% pulse-top ripple which must be reduced to 0.02% on a 33 KV modulator pulse, note the following:

$\Delta$ ripple=1% of 33000=330 V.P.

desired ripple=0.02% of 33000=6.6 V.P.

If a full code (max. value) of an 8-bit code is 330 V, one bit=330/256=1.29 V.

For an accuracy of ± one bit, ≅+1.3 V., drive amplifier 32 must have a gain of 330/10=33 (assuming D/A converter full scale =10 vp) and 8 amp. peak current handling capability at typical 0.015 duty cycle.

In accordance with the above, amplifier 20 will be required to have a 20 watt avg. power handling capability, well within the state of the art for solid state amplifiers.

It will be realized that various modifications are possible in the instrumentation of the invention, once the inventive concept is understood. Accordingly, it is not intended that the drawings or this description should be regarded as limiting the scope of the invention, these being intended to be typical and illustrative only.

It will be realized also from the foregoing that the invention provides a unique and particularly useful device for compensating the inherent pulse-top ripple in a high powered pulse such as used to modulate the travelling wave tube employed as a radio frequency power amplifier or the like. As previously indicated, one invariant instantaneous cathode to collector voltage across such a travelling wave tube is important if the amplitude and phase stability (RF) of the travelling wave tube itself are to be preserved. Preservation of those parameters is particularly important for moving target indicator processing circuits and certain other signal processing functions. The invention will be understood to fulfill its objectives of providing such stability in a relatively simple and low cost implementation.

What is claimed is:

1. In an electrical pulsing system including a utilization device having first and second terminals and pulsing means for applying repetitive voltage pulses to a first terminal of said device, said second terminal providing a current return path between said device and said pulsing means, said voltage pulses having a first ripple voltage component between pulse rise and fall times, and including ripple compensating means for applying a replica of said first ripple voltage to said utilization device second terminal to tend to hold the instantaneous voltage between said first and second terminals constant during each of said pulses, comprising:

first means for comparing the ripple voltages at said first and second utilization device terminals to generate a difference signal;

second means comprising a memory for repetitively storing a sample amplitude value for each of said samples, said amplitude values corresponding to the instantaneous values of said ripple voltage at said utilization device second terminal;

third means for driving said utilization device second terminal in accordance with amplitude values stored in said memory; and fourth means responsive to said first means difference signal to continuously control said stored amplitude values in said memory to produce minimum amplitude at the output of said first means.

2. A system according to claim 1 in which said memory is a digital memory for storing n digital words each of m digits, where n is the number of said sample amplitude values taken within the duration of each of said voltage pulses and in which fifth means are included for successively clocking said second means in n discrete time bins.

3. A system according to claim 2 in which said memory comprises a random access digital memory.

4. A system according to claim 2 in which said fifth means comprises means for dividing each of said time bins into two parts, a first part controlling said memory to read out the stored digital value for the corresponding time bin and a second part for writing a new digital value corresponding to the same time bin, and including a digital-to-analog converter responsive to said read out values to drive said utilization device second terminal.

5. A system according to claim 4 in which an adder of m bits is included responsive to said memory read out and an analog-to-digital converter is included, said analog-to-digital converter being responsive to said first means output and having its output connected to said adder to modify said memory read out value accordingly, the output of said adder comprising a new digital value connected to said memory and recorded therein when said fifth means controls said memory in the write mode for the same time bin.

6. A system according to claim 5 in which said analog-to-digital converter is of a form providing a maximum of one bit output, said adder being thereby limited to one digital bit of modification of said stored digital value in each time bin within a single one of said voltage pulses.

7. A system according to claim 5 or 6 in which a power amplifier is connected from said digital-to-analog converter output to said utilization device second terminal and in which sixth means are included for coupling substantially only said ripple component of said voltage pulse from said utilization device first terminal to said first means.

8. A system according to claim 5 in which the read and write connections between said memory and said adder and between said memory and said digital-to-analog converter are 8-bit parallel code connections.

9. A system according to claim 5 or 8 in which said fifth means includes means for m bit parallel clocking of said memory during each of said read and write parts of each of said time bins.

10. A system according to claim 1, 2, 3, 4, 5, 6 or 8 in which said utilization device is a travelling wave tube and said first and second terminals are the cathode and collector thereof, respectively, and a line type pulse modulator is provided for producing said voltage pulses.

* * * * *